(12) United States Patent
Cheng et al.

(10) Patent No.: US 7,468,538 B2
(45) Date of Patent: Dec. 23, 2008

(54) STRAINED SILICON ON A SIGE ON SOI SUBSTRATE

(75) Inventors: Kangguo Cheng, Beacon, NY (US); Dureseti Chidambarrao, Weston, CT (US)

(73) Assignee: International Business Machines Corporation, Armonk, NY (US)

( * ) Notice: Subject to any disclaimer, the term of this patent is extended or adjusted under 35 U.S.C. 154(b) by 263 days.

(21) Appl. No.: 11/061,444

(22) Filed: Feb. 22, 2005

(65) Prior Publication Data

US 2005/0142700 A1 Jun. 30, 2005

Related U.S. Application Data

(62) Division of application No. 10/706,061, filed on Nov. 13, 2003, now Pat. No. 7,029,964.

(51) Int. Cl.
*H01L 27/01* (2006.01)
(52) U.S. Cl. ............... 257/347; 257/522; 257/E23.013; 257/E29.295; 257/E29.298
(58) Field of Classification Search ........... 257/347, 257/522, E23.013, E29.295, E29.298, 288
See application file for complete search history.

(56) References Cited

U.S. PATENT DOCUMENTS 3,602,841 A    8/1971   McGroddy
4,665,415 A    5/1987   Esaki et al.
4,853,076 A    8/1989   Tsaur et al.
4,855,245 A    8/1989   Neppl et al.
4,952,524 A    8/1990   Lee et al.
4,958,213 A    9/1990   Eklund et al.

(Continued)

FOREIGN PATENT DOCUMENTS

JP            64-76755       3/1989

OTHER PUBLICATIONS

G. Zhang, et al., "A New 'Mixed-Mode' Reliability Degradation Mechanism in Advanced Si and SiGe Bipolar Transistors." IEEE Transactions on Electron Devices, vol. 49, No. 12, Dec. 2002, pp. 2151-2156.

(Continued)

*Primary Examiner*—Charles D. Garber
*Assistant Examiner*—Stanetta D Isaac
(74) *Attorney, Agent, or Firm*—Joseph P. Abate; Greenblum & Bernstein P.L.C.

(57) ABSTRACT

An intermediate semiconductor structure is disclosed. The semiconductor structure includes a substrate; a relaxed $Si_{1-x}Ge_x$ layer on the substrate, the relaxed $Si_{1-x}Ge_x$ layer having at least one trench; an un-etched Si layer portion on the substrate and beneath the relaxed $Si_{1-x}Ge_x$ layer along a periphery of the substrate providing structural support for the relaxed $Si_{1-x}Ge_x$ layer along the periphery of the substrate; and at least one void between the relaxed $Si_{1-x}Ge_x$ layer and the substrate, wherein the void encompasses an entire surface area of the substrate but for a portion of the substrate in contact with the un-etched Si layer portion.

6 Claims, 12 Drawing Sheets

U.S. PATENT DOCUMENTS

| | | |
|---|---|---|
| 5,006,913 A | 4/1991 | Sugahara et al. |
| 5,060,030 A | 10/1991 | Hoke |
| 5,081,513 A | 1/1992 | Jackson et al. |
| 5,108,843 A | 4/1992 | Ohtaka et al. |
| 5,134,085 A | 7/1992 | Gilgen et al. |
| 5,310,446 A | 5/1994 | Konishi et al. |
| 5,354,695 A | 10/1994 | Leedy |
| 5,371,399 A | 12/1994 | Burroughes et al. |
| 5,391,510 A | 2/1995 | Hsu et al. |
| 5,459,346 A | 10/1995 | Asakawa et al. |
| 5,471,948 A | 12/1995 | Burroughes et al. |
| 5,557,122 A | 9/1996 | Shrivastava et al. |
| 5,561,302 A | 10/1996 | Candelaria |
| 5,565,697 A | 10/1996 | Asakawa et al. |
| 5,571,741 A | 11/1996 | Leedy |
| 5,592,007 A | 1/1997 | Leedy |
| 5,592,018 A | 1/1997 | Leedy |
| 5,670,798 A | 9/1997 | Schetzina |
| 5,679,965 A | 10/1997 | Schetzina |
| 5,683,934 A | 11/1997 | Candelaria |
| 5,840,593 A | 11/1998 | Leedy |
| 5,861,651 A | 1/1999 | Brasen et al. |
| 5,880,040 A | 3/1999 | Sun et al. |
| 5,940,736 A | 8/1999 | Brady et al. |
| 5,946,559 A | 8/1999 | Leedy |
| 5,960,297 A | 9/1999 | Saki |
| 5,989,978 A | 11/1999 | Peidous |
| 6,008,126 A | 12/1999 | Leedy |
| 6,025,280 A | 2/2000 | Brady et al. |
| 6,046,464 A | 4/2000 | Schetzina |
| 6,066,545 A | 5/2000 | Doshi et al. |
| 6,090,684 A | 7/2000 | Ishitsuka et al. |
| 6,107,143 A | 8/2000 | Park et al. |
| 6,117,722 A | 9/2000 | Wuu et al. |
| 6,133,071 A | 10/2000 | Nagai |
| 6,165,383 A | 12/2000 | Chou |
| 6,204,145 B1 | 3/2001 | Noble |
| 6,221,735 B1 | 4/2001 | Manley et al. |
| 6,228,694 B1 | 5/2001 | Doyle et al. |
| 6,246,095 B1 | 6/2001 | Brady et al. |
| 6,255,169 B1 | 7/2001 | Li et al. |
| 6,261,964 B1 | 7/2001 | Wu et al. |
| 6,265,317 B1 | 7/2001 | Chiu et al. |
| 6,274,444 B1 | 8/2001 | Wang |
| 6,281,532 B1 | 8/2001 | Doyle et al. |
| 6,284,623 B1 | 9/2001 | Zhang et al. |
| 6,284,626 B1 | 9/2001 | Kim |
| 6,319,794 B1 | 11/2001 | Akatsu et al. |
| 6,361,885 B1 | 3/2002 | Chou |
| 6,362,082 B1 | 3/2002 | Doyle et al. |
| 6,368,931 B1 | 4/2002 | Kuhn et al. |
| 6,403,486 B1 | 6/2002 | Lou |
| 6,403,975 B1 | 6/2002 | Brunner et al. |
| 6,406,973 B1 | 6/2002 | Lee |
| 6,461,936 B1 | 10/2002 | von Ehrenwall |
| 6,476,462 B2 | 11/2002 | Shimizu et al. |
| 6,483,171 B1 | 11/2002 | Forbes et al. |
| 6,493,497 B1 | 12/2002 | Ramdani et al. |
| 6,498,358 B1 | 12/2002 | Lach et al. |
| 6,501,121 B1 | 12/2002 | Yu et al. |
| 6,506,652 B2 | 1/2003 | Jan et al. |
| 6,509,618 B2 | 1/2003 | Jan et al. |
| 6,521,964 B1 | 2/2003 | Jan et al. |
| 6,531,369 B1 | 3/2003 | Ozkan et al. |
| 6,531,740 B2 | 3/2003 | Bosco et al. |
| 6,717,216 B1 | 4/2004 | Doris et al. |
| 6,723,541 B2 | 4/2004 | Sugii et al. |
| 6,825,529 B2 | 11/2004 | Chidambarrao et al. |
| 6,831,292 B2 | 12/2004 | Currie et al. |
| 6,974,981 B2 | 12/2005 | Chidambarrao et al. |
| 6,977,194 B2 | 12/2005 | Belyansky et al. |
| 7,015,082 B2 | 3/2006 | Doris et al. |
| 2001/0009784 A1 | 7/2001 | Ma et al. |
| 2002/0063292 A1 | 5/2002 | Armstrong et al. |
| 2002/0074598 A1 | 6/2002 | Doyle et al. |
| 2002/0086472 A1 | 7/2002 | Roberds et al. |
| 2002/0086497 A1 | 7/2002 | Kwok |
| 2002/0090791 A1 | 7/2002 | Doyle et al. |
| 2003/0032261 A1 | 2/2003 | Yeh et al. |
| 2003/0040158 A1 | 2/2003 | Saitoh |
| 2003/0057184 A1 | 3/2003 | Yu et al. |
| 2003/0067035 A1 | 4/2003 | Tews et al. |
| 2004/0007715 A1* | 1/2004 | Webb et al. ............... 257/192 |
| 2004/0235264 A1 | 11/2004 | Forbes |
| 2004/0238914 A1 | 12/2004 | Deshpande et al. |
| 2004/0262784 A1 | 12/2004 | Doris et al. |
| 2005/0040460 A1 | 2/2005 | Chidambarrao et al. |
| 2005/0082634 A1 | 4/2005 | Doris et al. |
| 2005/0093030 A1 | 5/2005 | Doris et al. |
| 2005/0098829 A1 | 5/2005 | Doris et al. |
| 2005/0106799 A1 | 5/2005 | Doris et al. |
| 2005/0145954 A1 | 7/2005 | Zhu et al. |
| 2005/0148146 A1 | 7/2005 | Doris et al. |
| 2005/0194699 A1 | 9/2005 | Belyansky et al. |
| 2005/0236668 A1 | 10/2005 | Zhu et al. |
| 2005/0245017 A1 | 11/2005 | Belyansky et al. |
| 2005/0280051 A1 | 12/2005 | Chidambarrao et al. |
| 2005/0282325 A1 | 12/2005 | Belyansky et al. |
| 2006/0027868 A1 | 2/2006 | Doris et al. |
| 2006/0057787 A1 | 3/2006 | Doris et al. |
| 2006/0060925 A1 | 3/2006 | Doris et al. |

OTHER PUBLICATIONS

H.S. Momose, et al., "Temperature Dependence of Emitter-Base Reverse Stress Degradation and its Mechanism Analyzed by MOS Structures." 1989 IEEE, Paper 6.2, pp. 140-143.

C.J. Huang, et al., "Temperature Dependence and Post-Stress Recovery of Hot Electron Degradation Effects in Bipolar Transistors." IEEE 1991, Bipolar Circuits and Technology Meeting 7.5, pp. 170-173.

H. Li, et al., "Design of W-Band VCOs with High Output Power for Potential Application in 77 GHz Automotive Radar Systems." 2003, IEEE GaAs Digest, pp. 263-266.

H. Wurzer, et al., "Annealing of Degraded non-Transistors-Mechanisms and Modeling." IEEE Transactions on Electron Devices, vol. 41, No. 4, Apr. 1994, pp. 533-538.

B. Doyle, et al., "Recovery of Hot-Carrier Damage in Reoxidized Nitrided Oxide MOSFETs." IEEE Electron Device Letters, vol. 13, No. 1, Jan. 1992, pp. 38-40.

H.S. Momose, et al. "Analysis of the Temperature Dependence of Hot-Carrier-Induced Degradation in Bipolar Transistors for Bi-CMOS." IEEE Transactions on Electron Devices, vol. 41, No. 6, Jun. 1994, pp. 978-987.

M. Khater, et al., "SiGe HBT Technology with Fmax/Ft= 350/300 GHz and Gate Delay Below 3.3ps". 2004 IEEE, 4 pages.

J.C. Bean, et al., "GEx SI 1-x/Si Strained-Layer Superlattice Grown by Molecular Beam Epitaxy". J. Vac. Sci. Technol. A 2(2), Apr.-Jun. 1984, pp. 436-440.

J.H. Van Der Merwe, "Regular Articles". Journal of Applied Physics, vol. 34, No. 1, Jan. 1963, pp. 117-122.

J.W. Matthews, et al., "Defects in Epitaxial Multilayers". Journal of Crystal Growth 27 (1974), pp. 118-125.

Subramanian S. Iyer, et al. "Heterojunction Bipolar Transistors Using Si-Ge Alloys". IEEE Transactions on Electron Devices, vol. 36, No. 10, Oct. 1989, pp. 2043-2064.

R.H.M. Van De Leur, et al., "Critical Thickness for Pseudomorphic Growth of Si/Ge Alloys and Superlattices". J. Appl. Phys. 64 (6), Sep. 15, 1988, pp. 3043-3050.

D.C. Houghton, et al., "Equilibrium Critical Thickness for SI 1-x GEx Strained Layers on (100) Si". Appl. Phys. Lett. 56 (5), Jan. 29, 1990, pp. 460-462.

Q. Quyang et al., "Two-Dimensional Bandgap Engineering in a Novel Si/SiGe pMOSFET with Enhanced Device Performance and Scalability". 2000, IEEE, pp. 151-154.

Kern Rim, et al., "Transconductance Enhancement in Deep Submicron Strained-Si $n$-MOSFETs", International Electron Devices Meeting, 26, 8, 1, IEEE, Sep. 1998.

Kern Rim, et al., "Characteristics and Device Design of Sub-100 nm Strained Si N- and PMOSFETs", 2002 Symposium On VLSI Technology Digest of Technical Papers, IEEE, pp. 98-99.

Gregory Scott, et al., "NMOS Drive Current Reduction Caused by Transistor Layout and Trench Isolation Induced Stress", International Electron Devices Meeting, 34.4.1, IEEE, Sep. 1999.

F. Ootsuka, et al., "A Highly Dense, High-Performance 130nm node CMOS Technology for Large Scale System-on-a-Chip Application", International Electron Devices Meeting, 23.5.1, IEEE, Apr. 2000.

Shinya Ito, et al., "Mechanical Stress Effect of Etch-Stop Nitride and its Impace on Deep Submicron Transistor Design", International Electron Devices Meeting, 10.7.1, IEEE, Apr. 2000.

S. Shimizu, et al., "Local Mechanical-Stress Control (LMC): A New Technique for CMOS-Performance Enhancement", International Electron Devices Meeting, IEEE, Mar. 2001.

K. Ota, et al., "Novel Locally Strained Channel Technique for high Performance 55nm CMOS", International Electron Devices Meeting, 2.2.1, IEEE, Feb. 2002.

* cited by examiner

US 7,468,538 B2

STRAINED SILICON ON A SIGE ON SOI SUBSTRATE

CROSS REFERENCE TO RELATED APPLICATION

This application is a divisional application of U.S. application Ser. No. 10/706,061, filed on Nov. 13, 2003 now U.S. Pat. No. 7,029,964, which is now incorporated herein by reference in its entirety.

BACKGROUND OF THE INVENTION

1. Field of the Invention

The invention generally relates to a semiconductor device and method of manufacture and, more particularly, to a semiconductor device that includes strained silicon on a SiGe on a silicon-on-insulator substrate.

2. Background Description

Various techniques have emerged to improve performance of state of the art semiconductors. One technique involves introducing strain. Strained silicon exhibits improved semiconductor performance due to enhanced transport properties. Biaxial distortion of the crystal lattice in strained silicon improves electron and hole mobility.

Another performance enhancement technique involves providing a semiconductor layer separated from the substrate by an insulating layer. Also known as silicon-on-insulator (SOI), such structures exhibit reduced parasitic capacitance, thereby enabling a semiconductor to function at significantly higher speeds with reduced electrical losses. The result is an appreciable increase in performance and a reduction in power consumption.

By combining strained silicon with SOI the substantial benefits of both technologies may be realized. Unfortunately, however, current methods for forming strained silicon on SOI suffer drawbacks. One such method, the SIMOX method entails implantation of very high doses of oxygen ions at high energy. Upon annealing, the oxygen forms an oxide layer under the surface of the semiconductor. A problem with SIMOX is that it is relatively costly procedure. Another problem is that the high SIMOX annealing temperature (1350° C.) limits the concentration of germanium in SiGe-on-insulator substrates. For wafer bonding, which is another method, there are several technical hurdles including optimization of chemical mechanical polish, bonding conditions and the reduction in dislocation density.

The invention is directed to overcoming one or more of the problems as set forth above.

SUMMARY OF THE INVENTION

The invention solves the problems and/or overcomes the drawbacks and disadvantages of the prior art by providing a semiconductor device with an undercut relaxed SiGe layer. Voids beneath the SiGe layer are filled with dielectric. A strained Si layer is formed on the relaxed SiGe layer. The resulting semiconductor structure thus combines the benefits of a defect-free strained Si surface and a silicon-on-insulator substrate.

According to one aspect of the invention, an intermediate semiconductor structure is formed on a substrate. The structure includes a semiconductor substrate and a relaxed $Si_{1-x}Ge_x$ portion on a semiconductor substrate. The relaxed $Si_{1-x}Ge_x$ portion includes one or more channel or trench regions. The structure includes at least one void between the $Si_{1-x}Ge_x$ portion and the substrate. Voids beneath the $Si_{1-x}Ge_x$ layer may be formed by undercutting. The voids may subsequently be filled with dielectric.

DETAILED DESCRIPTION OF EMBODIMENTS OF THE INVENTION

The invention enables fabrication of a strained silicon layer on a SiGe-on-insulator substrate. An exemplary methodology in accordance with the invention entails undercutting a SiGe layer to form a relaxed SiGe island, filling the voids with a dielectric and epitaxially growing Si on the relaxed SiGe. The strained Si thus formed can be free of dislocations and misfits. The resulting structure can also be fabricated cost effectively using conventional processing equipment and materials. Additionally, the structure allows a thin SiGe layer, which enables shallow junctions and enhanced device performance.

Figure 1:
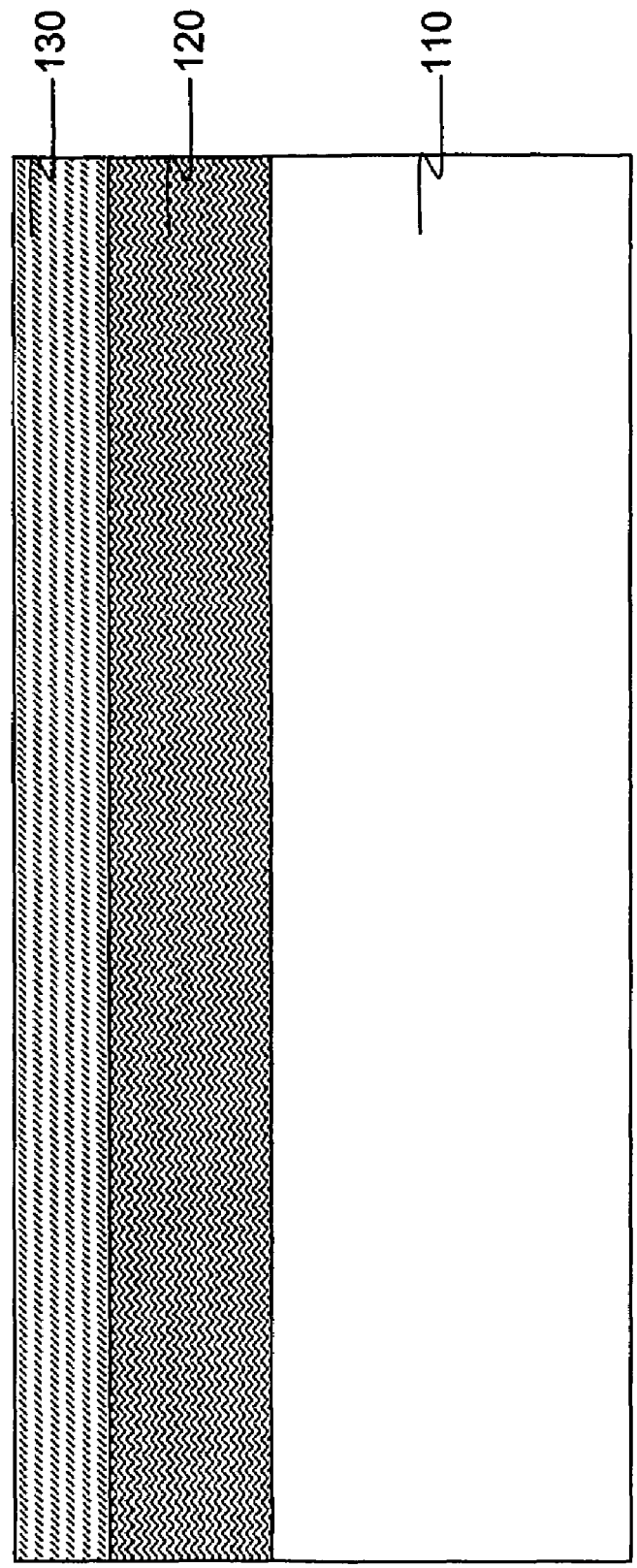
FIG. 1 shows a silicon-on-insulator wafer for use in accordance with the principles of the invention.
Figure 12:
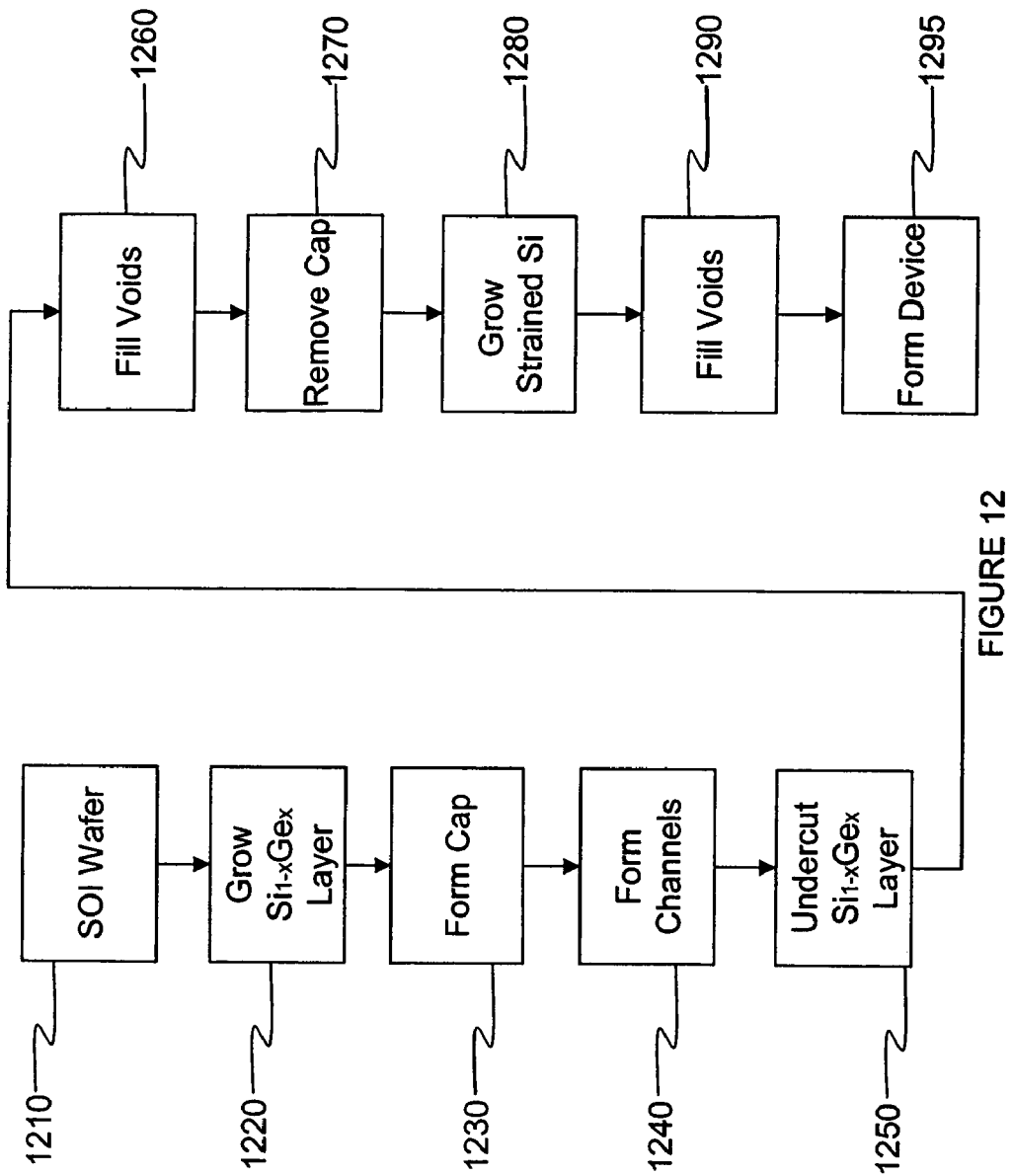
FIG. 12 is a flowchart of a method for producing a strained silicon layer on a SiGe-on-insulator substrate in accordance with the principles of the invention.

Referring now to FIG. 1, a silicon-on-insulator (SOI) wafer is shown. Such wafers are commercially available starting substrates for various discrete and integrated circuit (IC) semiconductor device applications. The wafer includes a buried silicon oxide (BOX) layer 120 extending across the entire wafer, just below a thin (e.g., 5 to 200 nm) surface layer of device-quality single-crystal silicon 130. The BOX layer 120 provides robust vertical isolation from the substrate 110. The substrate 110 may be silicon, germanium, silicon germanium, aluminum oxide, or any other suitable semiconductor or insulator. Providing an SOI wafer is a first step 1210 of an exemplary process flow as shown in the flowchart of FIG. 12.

The SOI wafer may be fabricated using any of various techniques known in the art. By way of example and not limitation, the SOI wafer may be fabricated using the SIMOX (Separation by IMplanted OXygen) process, which employs high dose ion implantation of oxygen and high temperature annealing to form the BOX layer in a bulk wafer. As another example, the SOI wafer can be fabricated by bonding a device quality silicon wafer to another wafer (the substrate layer) that has an oxide layer on its surface. The pair is then split apart, using a process that leaves a thin (relative to the thickness of the starting wafer), device-quality layer of single crystal silicon on top of the oxide layer (which has now become the BOX) on the substrate layer. The SOI wafer may also be formed using other processes. The method of fabricating the SOI wafer is not critical to this invention.

Figure 2:
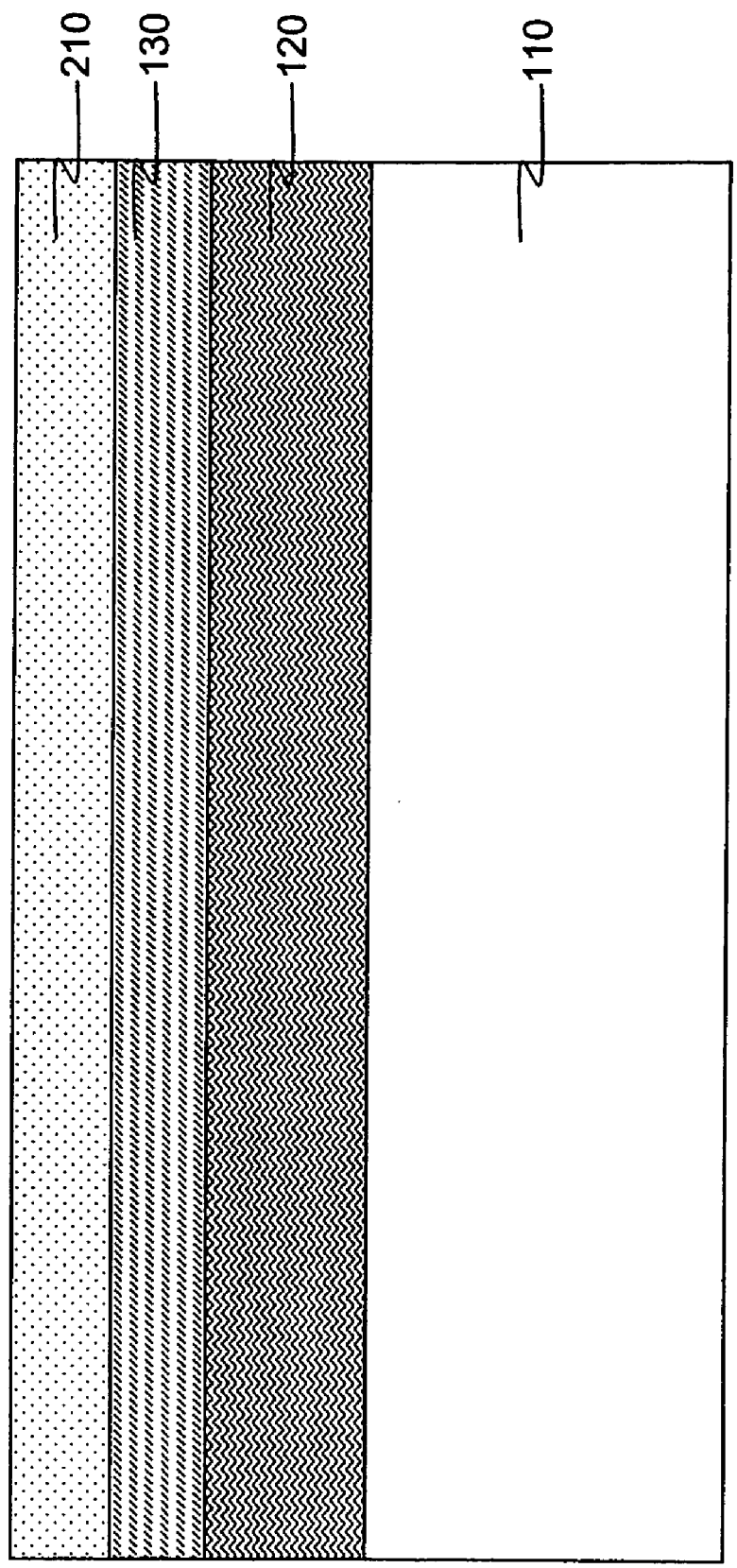
FIG. 2 shows a semiconductor structure with a top layer of SiGe in accordance with the principles of the invention.

Next, as shown in FIG. 2, a thin device-quality silicon germanium layer (SiGe or $Si_{1-x}Ge_x$) 210 is formed on the device-quality single-crystal silicon layer 130. The $Si_{1-x}Ge_x$ layer 210 may be deposited or grown on the Si layer using conventional techniques such as chemical vapor deposition methods. For example, ultrahigh vacuum chemical vapor deposition (UHVCVD) may be used in a conventional manner to grow a device quality $Si_{1-x}Ge_x$ layer. Other conventional techniques include rapid thermal chemical vapor deposition (RTCVD), low-pressure chemical vapor deposition (LPCVD), limited reaction processing CVD (LRPCVD) and molecular beam epitaxy (MBE). Growth of a $Si_{1-x}Ge_x$ layer is a second step 1220 of an exemplary process flow in accordance with the principles of the invention as shown in FIG. 12.

In an exemplary implementation, the thickness of the $Si_{1-x}Ge_x$ layer 210 is below the critical thickness, as is known in the art. The critical thickness, which depends upon parameters such as growth rate, growth temperature, germanium concentration and the thickness of the underneath silicon layer, is the thickness beyond which defects such as dislocations and misfits form. By way of example, a thickness of approximately 5 to 100 nm would be less than the critical thickness for many fabrications.

Figure 3:
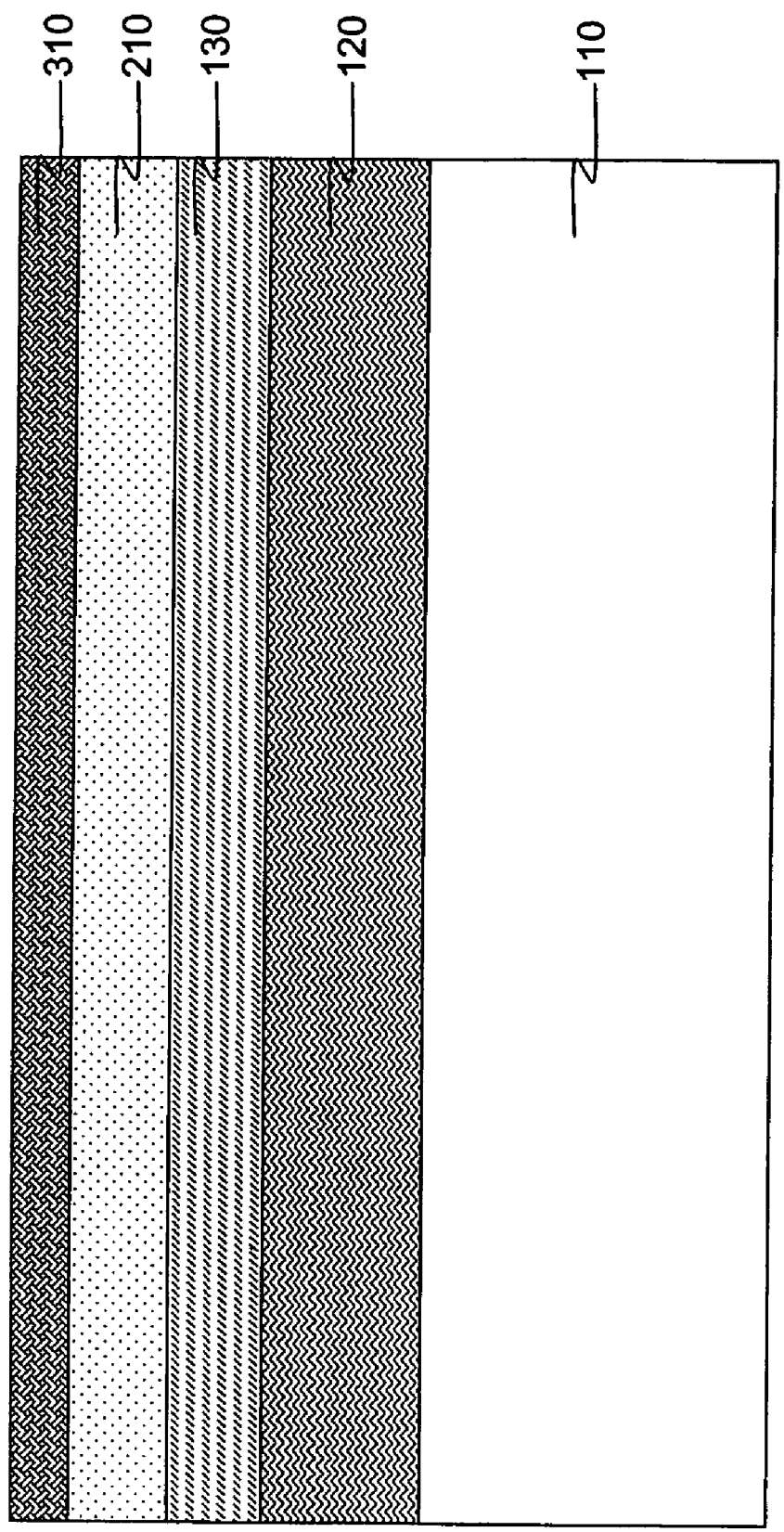
FIG. 3 shows a semiconductor structure with a layer of SiGe capped with a dielectric layer and trenches in accordance with the principles of the invention.

Referring to FIG. 3, a cap layer 310, may be formed on the $Si_{1-x}Ge_x$ layer 210. The cap layer 310 protects the top surface of the $Si_{1-x}Ge_x$ layer 210 from etching as described more fully below. The cap layer 310 may be comprised of a dielectric material such as silicon nitride ($Si_3N_4$) or $Si_3N_4$ atop an oxide ($SiO_2$) layer. The $Si_3N_4$ layer may be approximately 20nm to 100 nm thick. If the cap 310 includes a $SiO_2$ layer, the $SiO_2$ layer may be approximately 3 nm to 20 nm thick. The $SiO_2$ and $Si_3N_4$ layer may be formed by thermal growth on the $Si_{1-x}Ge_x$ layer 210 or by a conventional deposition technique such as low pressure CVD, plasma-assisted CVD, high-density plasma CVD or other suitable processes. For clarity, the cap layer 310 is shown as a single layer in FIG. 3. Cap formation is a third step 1230 of an exemplary process flow in accordance with the principles of the invention as shown in FIG. 12.

Figure 4:
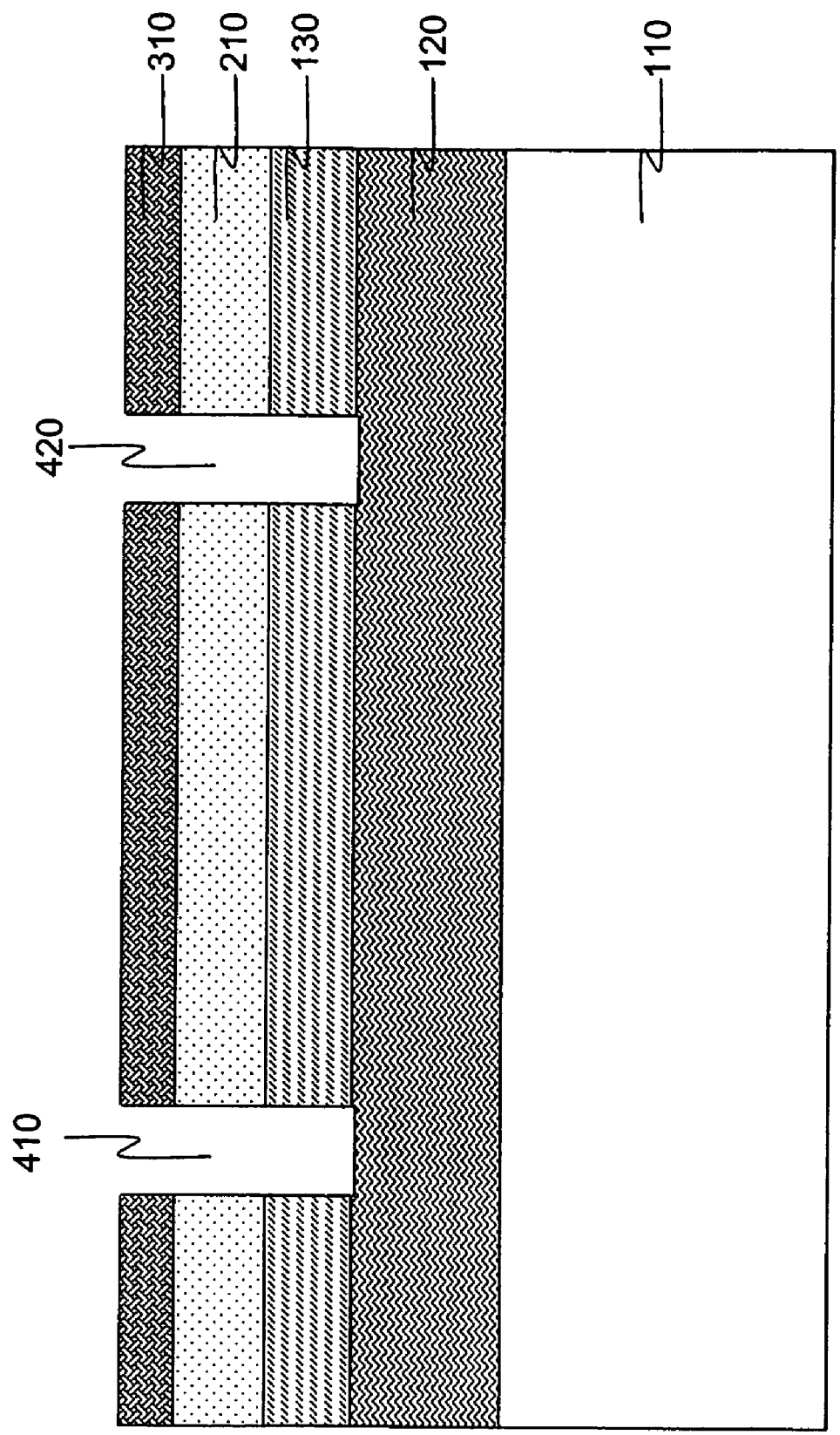
FIG. 4 shows a semiconductor structure with a layer of SiGe capped with a dielectric layer and having trenches in accordance with the principles of the invention.

Referring now to FIG. 4, channels or trenches 410 and 420 are formed in the cap 310, $Si_{1-x}Ge_x$ 210 and silicon 130 layers, stopping on the BOX layer 120, using conventional dry or wet etching processes. After forming the cap layer 310 atop the $Si_{1-x}Ge_x$ 210, a conventional photoresist mask (not shown), combined with an optional hardmask (not shown), for example, $SiO_2$, may be formed atop the cap layer 310. The photoresist mask may be patterned utilizing conventional lithography including resist exposure and development. Trenches 410 and 420 are formed using the patterned photoresist and conventional etching such as dry etching processes, e.g., reactive ion etching (RIE), ion-beam etching, plasma-etching or any combination thereof. Photoresist may be stripped after etching the hardmask, after etching the cap layer or after etching the entire trenches. The remaining $SiO_2$ hardmask, if any, may be stripped after forming the trenches. The trenches 410 and 420 are dimensioned and spaced to accommodate active regions of the device. Spacing between trenches may, for example, be approximately 100 to 200 nm. Trench or channel formation is a fourth step 1240 of an exemplary process flow in accordance with the principles of the invention as shown in FIG. 12.

Figure 5:
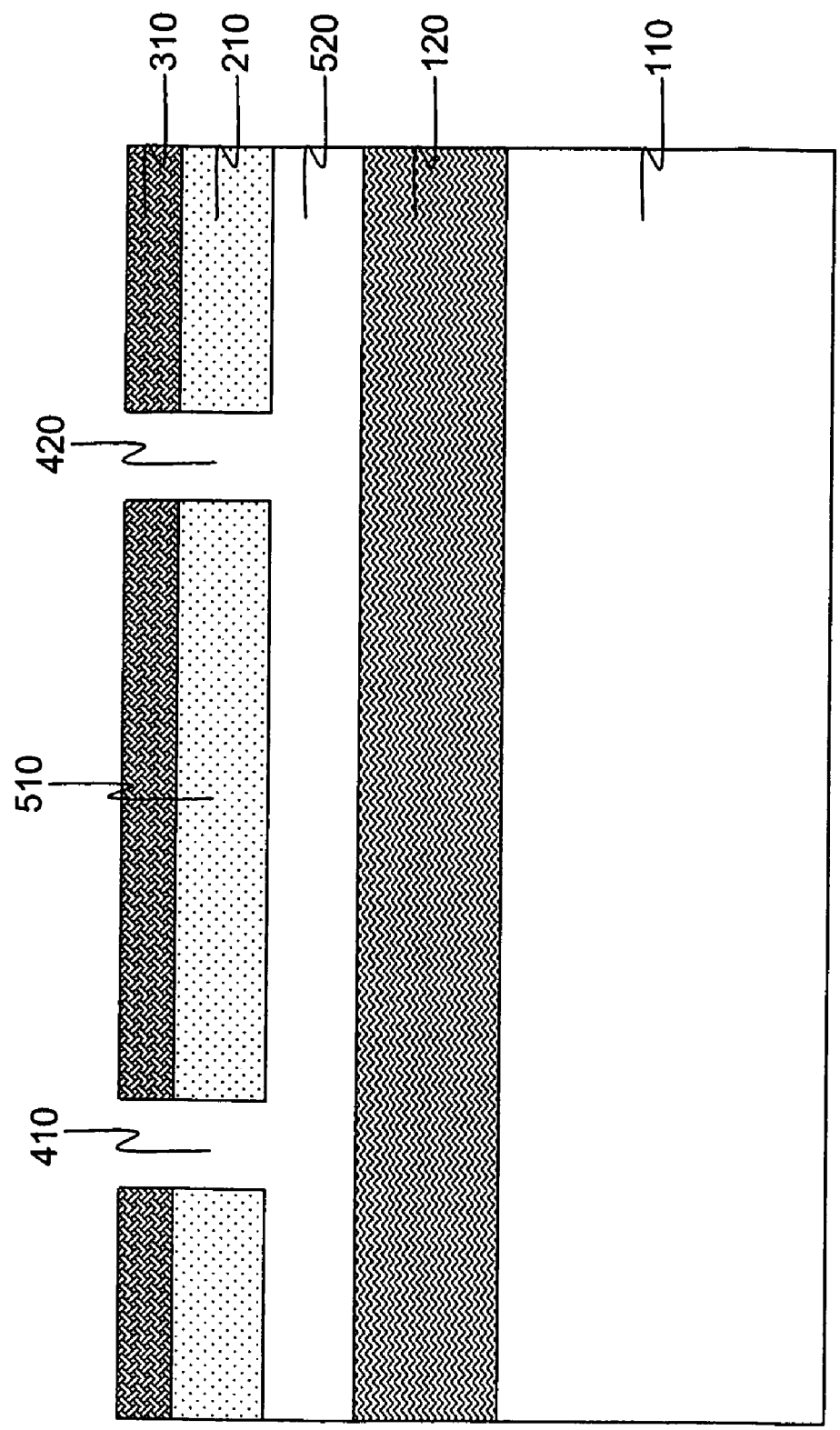
FIG. 5 shows a semiconductor structure with a layer of SiGe capped with a dielectric layer, trenches, and an undercut SiGe island in accordance with the principles of the invention.

Referring now to FIG. 5, a portion of the SOI beneath the $Si_{1-x}Ge_x$ 210 layer is removed to form a void 520 beneath the $Si_{1-x}Ge_x$ layer 210. The portion 510 of the $Si_{1-x}Ge_x$ layer 210 above the void 520 and between the trenches 410 and 420 becomes relaxed upon removal of the underlying SOI. The SOI may be removed using a conventional selective timed etching process, such as an ammonia, ammonia-based etchant (e.g., tetramethyl ammonium hydroxide (TMAH)), or a mixture of nitric and hydrofluoric acids, for example. The etch time is predetermined by the etch rate and the spacing between the trenches. The etch rate, which depends heavily upon various factors including concentration, temperature and crystallographic orientation, may vary from approximately 0.01 to 1.5 μm/minute. The difference in etch rate between $Si_{1-x}Ge_x$ and pure silicon is attributed to the change in energy band structure by the addition of germanium. The composition of the $Si_{1-x}Ge_x$ layer 210 may be engineered, such that the bottom surface is considerably more resistant to the etchant than the remaining portion of the $Si_{1-x}Ge_x$ layer 210. For example, the bottom surface may (or may not) have a higher germanium concentration. The cap layer 310 protects the top surface of the $Si_{1-x}Ge_x$ layer 210 from being etched in the process of removing the SOI layer. The timed etch proceeds for sufficient time to remove enough SOI from below the $Si_{1-x}Ge_x$ layer 210 to form a relaxed $Si_{1-x}Ge_x$ portion 510 that is large enough to define or include an active area. The removal of SOI, also referred to as undercutting, is a fifth step 1250 of an exemplary process flow in accordance with the principles of the invention as shown in FIG. 12.

Figure 6:
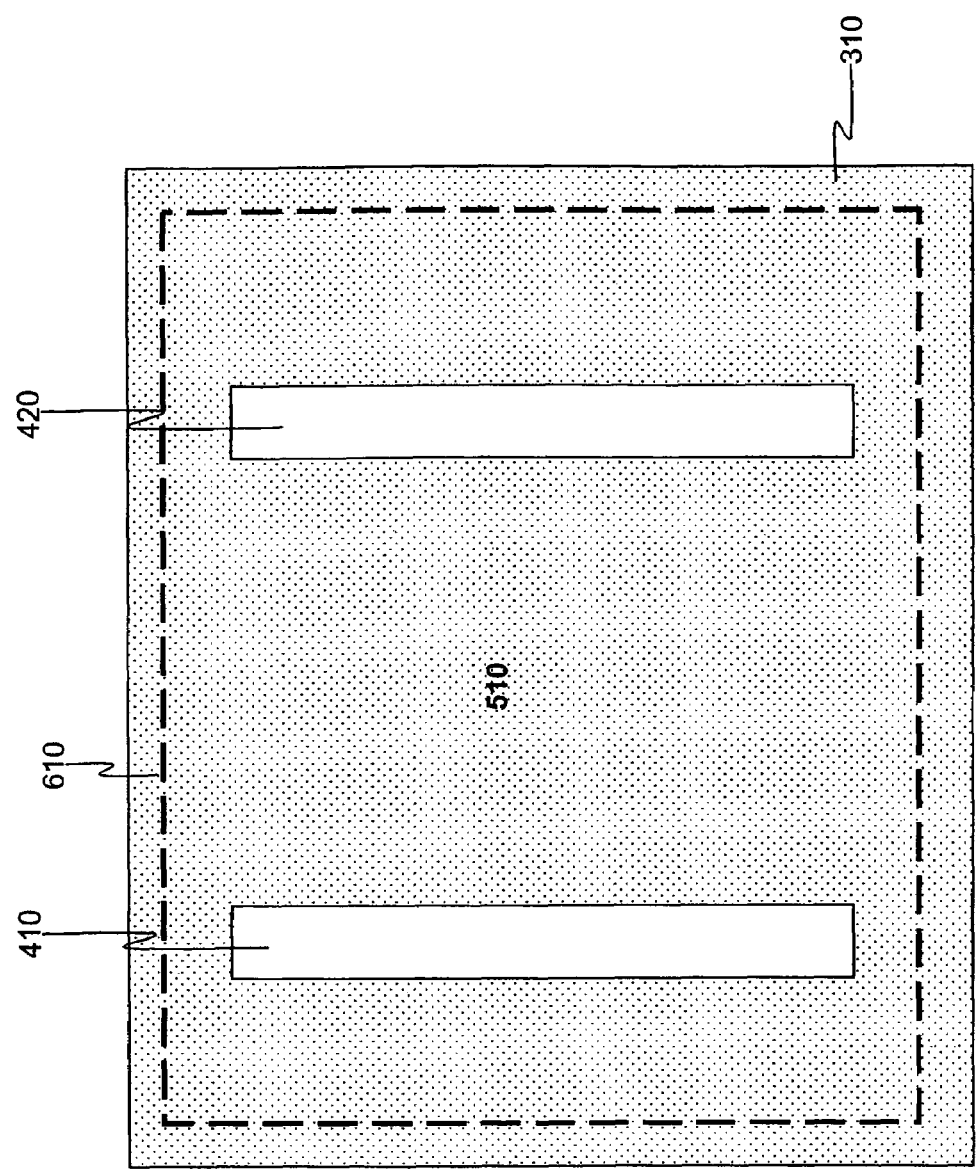
FIG. 6, shows a top view of a cut away section of a structure capped with a dielectric layer, trenches and an undercut SiGe island in accordance with the principles of the invention.

Referring now to FIG. 6, a top view of a portion of the structure with cap layer 310 over the $Si_{1-x}Ge_x$ layer 210 is shown. Channels 410 and 420 extend parallel or substantially parallel to each other. The dashed border 610 conceptually defines a portion undercut beneath the relaxed $Si_{1-x}Ge_x$ island 510. Un-etched SOI of layer 130 remains outside of the dashed border 610, thus providing structural support beneath the $Si_{1-x}Ge_x$ layer 210. Within the dashed border 610, SOI from layer 130 has been removed by etching as described above. While the dashed border 610 exhibits a square or rectangular shape as shown in FIG. 6, those skilled in the art will appreciate that etching may proceed in all directions, possibly at uneven rates depending upon the etchant, etching parameters, crystallographic orientation, and etched material. Thus, the invention is not limited to an etching border of any particular shape.

Optionally, after undercutting, the $Si_{1-x}Ge_x$ layer 210 may be thermally annealed at a temperature of about 600 to 900° C. to ensure that it is relaxed. The anneal can be either a furnace anneal, which may require several minutes, or a rapid thermal anneal (RTA), which may require 1 to 100 seconds.

Figure 7:
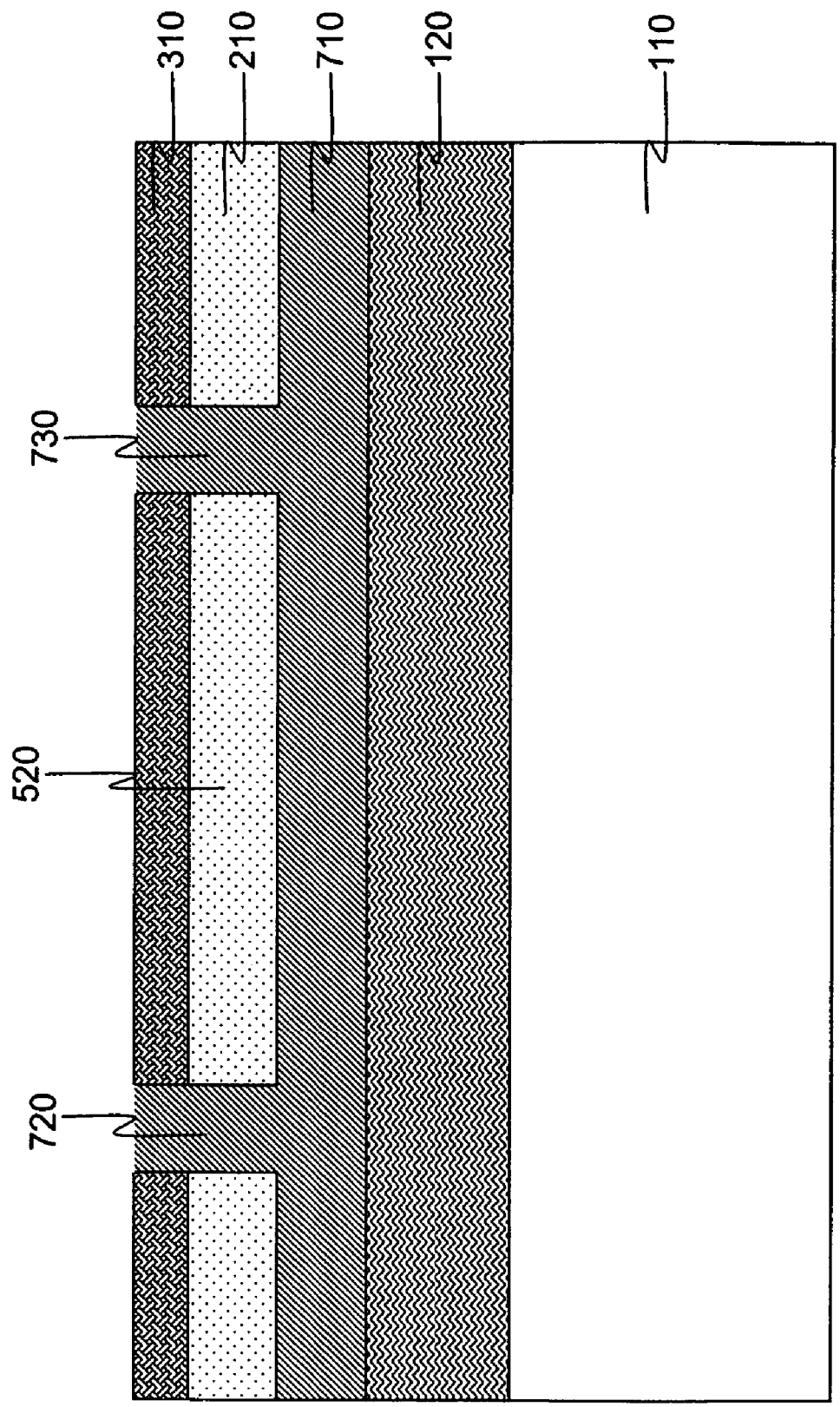
FIG. 7 shows a semiconductor structure that is capped with a dielectric layer and has an underlying layer of SiGe, trenches and an undercut area filled with dielectric in accordance with the principles of the invention.

Next, the trenches and undercut areas are filled with a dielectric, such as $SiO_2$ 710, as shown in FIG. 7. The dielectric may be applied in a conventional manner, such as by using an atmospheric CVD process, a low-pressure CVD process or a high-density plasma CVD process, or other suitable methodologies. As SiO$_2$ exhibits good isotropic properties, even the void 520 beneath the Si$_{1-x}$Ge$_x$ island 510 may be filled. The surface may then be planarized to remove the excess SiO$_2$ and leave the vertical channel portions 720 and 730 of the SiO$_2$ substantially planar with the cap layer 310. The planarization may be achieved by chemically mechanical polishing (CMP) or other suitable planarization methods. The filling of trenches and undercut voids is a sixth step 1260 of an exemplary process flow in accordance with the principles of the invention as shown in FIG. 12.

Figure 8:
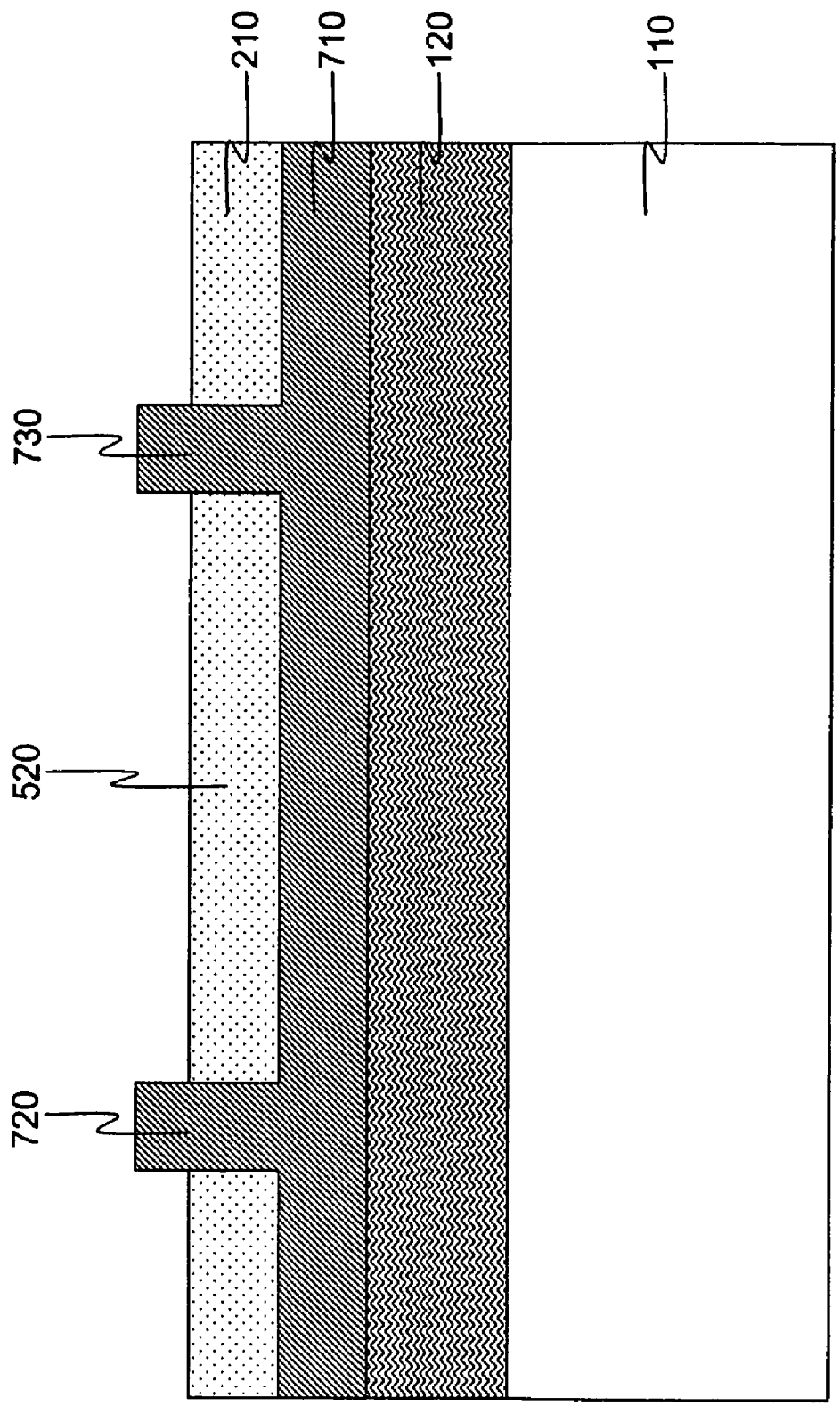
FIG. 8 shows a semiconductor structure with a layer of SiGe, trenches and an undercut area filled with dielectric, and dielectric extending vertically above the surface of the SiGe layer into a layer that previously included a dielectric cap.

Referring now to FIG. 8, the cap layer 310 is removed to expose the relaxed Si$_{1-x}$Ge$_x$ layer 210. A conventional wet or dry etch may be performed to remove the cap layer, leaving behind the vertical channel portions 720 and 730 of the SiO$_2$. If the cap layer is comprised of a plurality of layers of different materials, a plurality of wet or dry etch steps may be performed to remove the material. For example, Si$_3$N$_4$ in the cap layer may be etched by a mixture of hydrofluoric and ethylene glycol (HF/EG), or hot phosphoric acid (H$_3$PO$_4$). SiO$_2$, if previously formed in the cap layer, may be etched by buffered hydrofluoric (BHF) or diluted hydrofluoric (DHF). Alternatively, the SiO$_2$ in the cap layer may be stripped along with Si$_3$N$_4$ by a single step of HF/EG etch. Depending upon the etching process, the vertical channel portions 720 and 730 that extend above the Si$_{1-x}$Ge$_x$ layer 210 may (or may not) be removed. The removal of the cap is a seventh step 1270 of an exemplary process flow in accordance with the principles of the invention as shown in FIG. 12.

Figure 9:
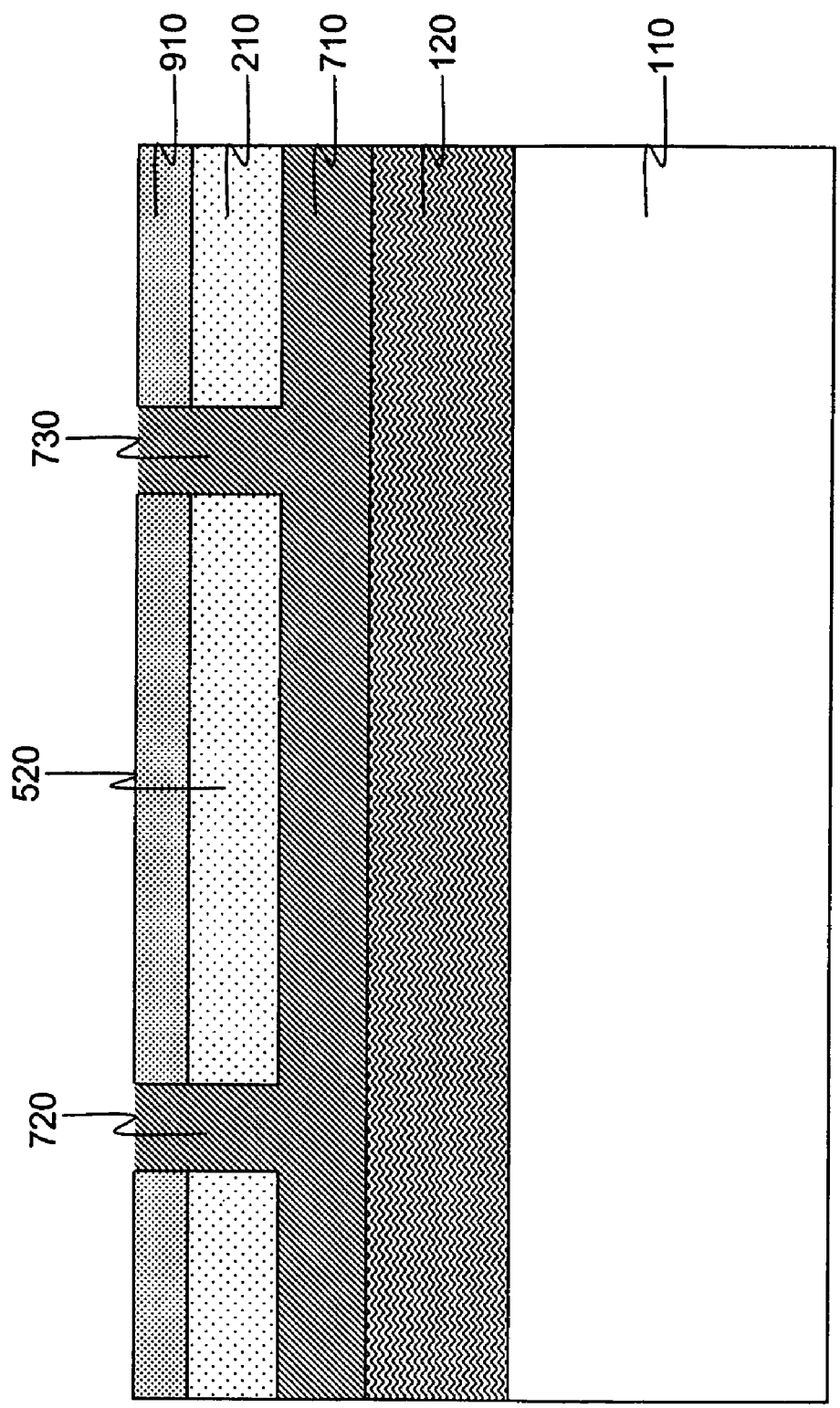
FIG. 9 shows a semiconductor structure with a top layer of strained semiconductor layer formed selectively on SiGe in accordance with the principles of the invention.

Referring now to FIG. 9, a strained Si layer 910 is formed on the relaxed Si$_{1-x}$Ge$_x$ layer 210. The strained Si layer may be formed epitaxially on the relaxed Si$_{1-x}$Ge$_x$ layer 210 using conventional techniques. For example, ultrahigh vacuum chemical vapor deposition (UHVCVD) may be used in a conventional manner to grow a device quality Si$_{1-x}$Ge$_x$ layer. Other suitable techniques include rapid thermal chemical vapor deposition (RTCVD), low-pressure chemical vapor deposition (LPCVD), limited reaction processing CVD (LR-PCVD) and molecular beam epitaxy (MBE). Formation of the strained Si layer is an eighth step 1280 of an exemplary process flow in accordance with the principles of the invention as shown in FIG. 12.

If a thick underlying Si$_{1-x}$Ge$_x$ layer is desired, an epitaxial growth or deposition of additional Si$_{1-x}$Ge$_x$ may be performed after the cap layer 310 is removed and before formation of the strained Si layer 910. The strained Si layer 910 may then be formed on the thick Si$_{1-x}$Ge$_x$ layer.

Because Si has a smaller lattice constant (i.e., atom spacing) than Ge, when Si is grown on the Si$_{1-x}$Ge$_x$ layer 210, the Si is strained in tension. Due to enhanced mobility of electrons and holes, the strained Si layer provides an attractive platform for fabricating high performance integrated circuits. For example, nFET mobility increases substantially with strain, with the enhancement beginning to saturate at higher strain (e.g., greater than 1.3%). On the other hand, pFET mobility initially exhibits a slight degradation at low amount of tensile strain, but increases linearly with higher strain.

Figure 10:
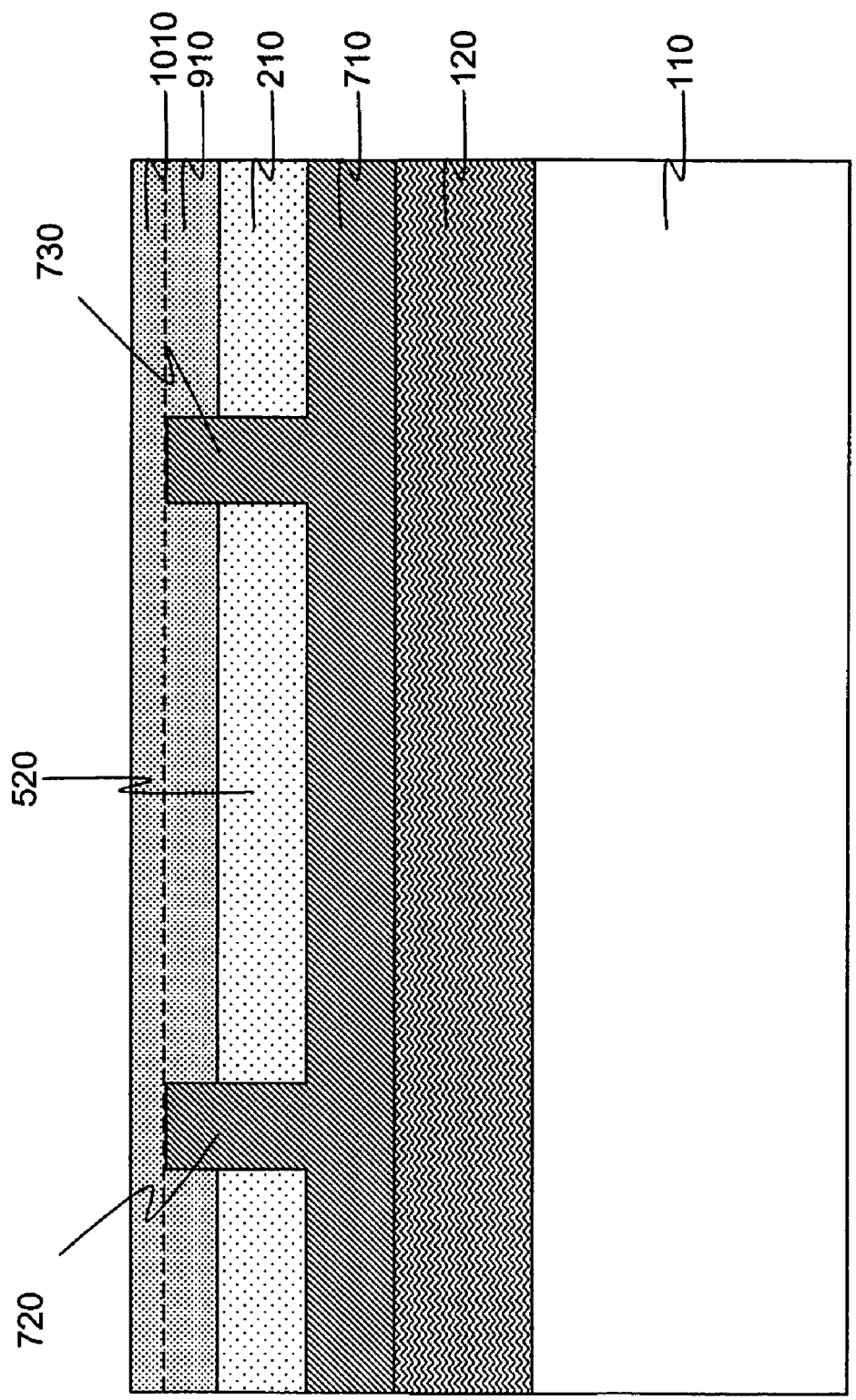
FIG. 10 shows a semiconductor structure with a top layer of strained silicon formed non-selectively over the entire surface in accordance with the principles of the invention.

FIG. 9 shows an embodiment in which the strained Si layer 910 is grown selectively on Si$_{1-x}$Ge$_x$ layer 210, not on the vertical channel portion 720 and 730 of the SiO$_2$, using a process such as molecular beam epitaxy. FIG. 10 shows an alternative embodiment in which the strained Si layer 910 is formed in a non-selective manner over the entire surface. In this case, the Si layer 910 also includes the portion 1010 formed above the vertical channel portions 720 and 730 of the SiO$_2$. After forming the strained Si layer 910, if necessary, the surface may be planarized by chemical mechanical polishing (CMP) or any other suitable processes.

A small amount of carbon may optionally be added during Si growth to form a carbon-doped silicon (S$_{1-y}$C$_y$) layer in which the strain is increased further. The value of y in Si$_{1-y}$C$_y$ may, by way of example, be approximately 0.001 to 0.02. For simplicity, the layer 710 is referred to and shown as a strained Si layer or Si layer hereinafter.

A suitable thickness for the strained Si layer 910 is below the critical thickness, which is the maximum thickness that strained Si can grow on the Si$_{1-x}$Ge$_x$ layer 210 without forming defects in the crystal structure (e.g., dislocations). By way of example but not limitation, the strained Si layer 910 may be approximately 5 to 100 nm thick. The epitaxial growth of the Si layer 910 is an eighth step 1280 of an exemplary process flow in accordance with the principles of the invention as shown in FIG. 12.

The structures formed, as shown in FIGS. 4 through 10, are intermediate structures that accommodate formation of semiconductor devices, such as pFETs and nFETs, in accordance with the principles of the invention. One intermediate structure exhibits a void 520 undercut beneath a portion (e.g., island) 510 of the Si$_{1-x}$Ge$_x$ layer to relax the undercut Si$_{1-x}$Ge$_x$ portion, as shown in FIG. 5. Another intermediate structure, by way of example, exhibits a thin strained semiconductor layer (e.g., a Si layer) 910 epitaxially grown on the Si$_{1-x}$Ge$_x$ layer 210, as shown in FIG. 9. The intermediate structures thus combine the benefits of a thin strained semiconductor layer with the benefits of SOI. Furthermore, the undercutting step obviates the need for costly and potentially problematic process steps, such as SIMOX or wafer bonding, to create the relaxed Si$_{1-x}$Ge$_x$ layer on SiO$_2$. Moreover, the formation of a thin strained Si layer 910 on the relaxed Si$_{1-x}$Ge$_x$ layer 210 is less conducive to defect formation in the strained Si layer 910, than in conventional processes.

Figure 11:
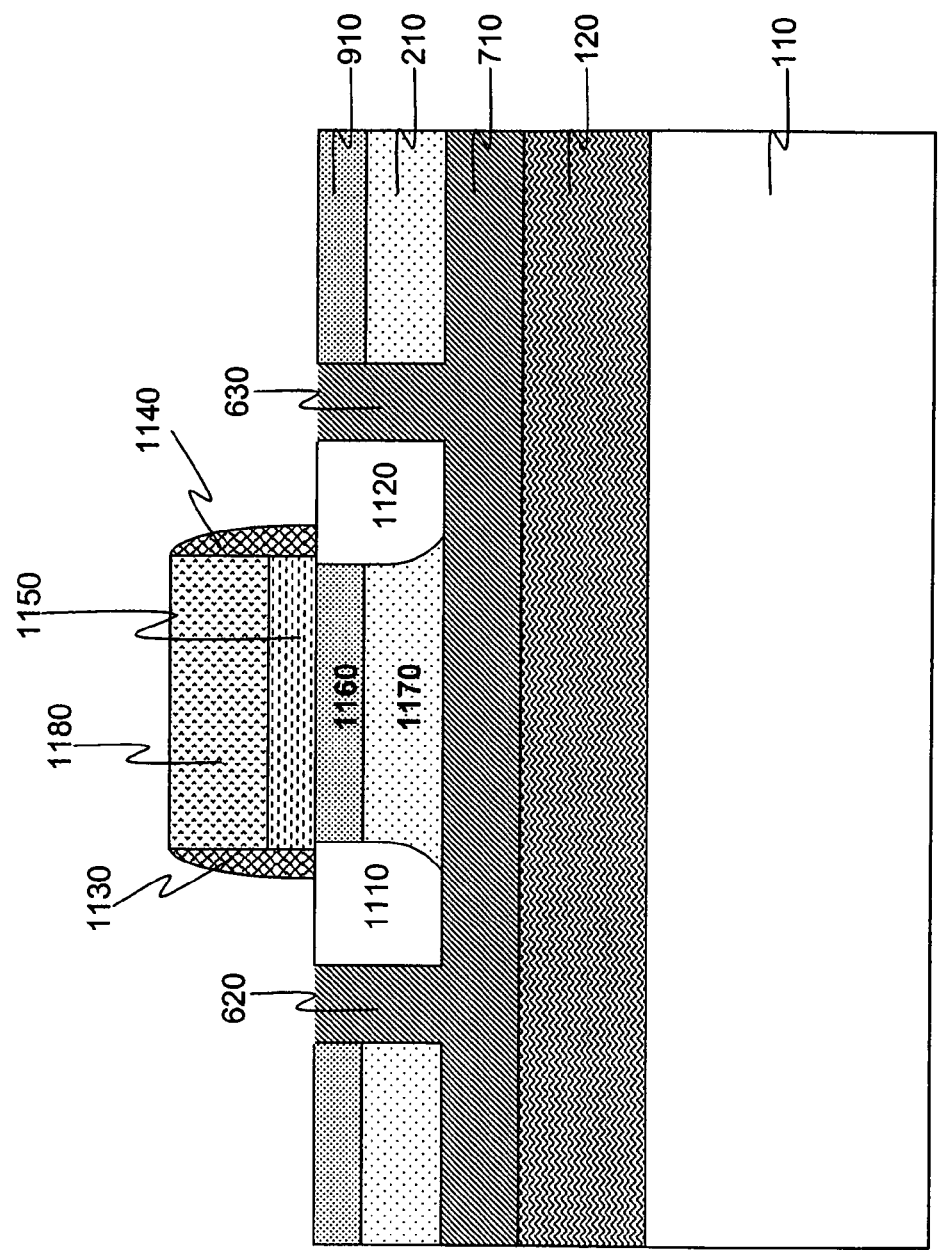
FIG. 11 shows a field effect transistor formed on a semiconductor structure in accordance with the principles of the invention.

Next, standard CMOS processes may be performed to form devices such as field effect transistors on the structure as shown in FIG. 11. The device includes source 1110 and drain 1120 regions separated by a strained Si channel 1160 situated on a Si$_{1-x}$Ge$_x$ layer 1170. A gate oxide 1150 is provided atop the strained Si channel 1160, and a gate conductor 1180 is provided on top of the gate oxide 1150. Spacers 1130 and 1140 are also provided. These components are found in typical field effect transistors and further explanation is not needed for one of ordinary skill in the art to readily understand the fabrication process of the FET device. Active device formation is a final step 1290 of an exemplary process flow in accordance with the principles of the invention as shown in FIG. 12.

Those skilled in the art will appreciate that a process according to the principles of the invention may include steps in addition to those described above and illustrated in the flowchart of FIG. 12. Those skilled in the art will also appreciate that a strained Si or S$_{1-y}$C$_y$ on S$_{1-x}$Ge$_x$ structure formed according to the principles of the invention may be used to support various integrated circuit devices, including devices other than the field effect transistor shown in FIG. 11.

Advantageously, the invention provides a semiconductor device with an undercut relaxed SiGe layer. Voids beneath the SiGe layer may be filled with dielectric. A strained Si layer may be deposited on the relaxed SiGe layer. The resulting semiconductor structure combines the benefits of a defect-free strained Si surface and a silicon-on-insulator substrate. The structure may be fabricated cost effectively using conventional processing equipment and materials. Additionally, because the relaxed SiGe layer may be relatively thin, the structure accommodates shallow junctions which reduce junction capacitance.

While the invention has been described in terms of exemplary embodiments, those skilled in the art will recognize that the invention can be practiced with modifications and in the spirit and scope of the appended claims.

What is claimed is:

1. An intermediate semiconductor structure comprising:
   a substrate;
   a relaxed $Si_{1-x}Ge_x$ layer on the substrate, the relaxed $Si_{1-x}Ge_x$ layer having at least one trench;
   an un-etched Si layer portion on the substrate and beneath the relaxed $Si_{1-x}Ge_x$ layer alone a periphery of the substrate providing structural support for the relaxed $Si_{1-x}Ge_x$ layer along the periphery of the substrate; and
   at least one void between the relaxed $Si_{1-x}Ge_x$ layer and the substrate, wherein the at least one void encompasses an entire surface area of the substrate but for a portion of the substrate in contact with the un-etched Si layer portion.

2. An intermediate semiconductor structure according to claim 1, wherein the substrate is comprised of a silicon-on-insulator wafer.

3. An intermediate semiconductor structure according to claim 1, wherein the thickness of the $Si_{1-x}Ge_x$ layer is less than a critical thickness for the $Si_{1-x}Ge_x$ layer.

4. An intermediate semiconductor structure according to claim 1, further comprising a strained semiconductor layer epitaxially grown on the relaxed $Si_{1-x}Ge_x$ layer.

5. An intermediate semiconductor structure according to claim 4, wherein the strained semiconductor layer is comprised of Si.

6. An intermediate semiconductor structure according to claim 4, wherein the strained semiconductor layer is comprised of $Si_{1-y}C_y$.

* * * * *